(12) United States Patent
Manohararajah

(10) Patent No.: US 8,578,306 B2
(45) Date of Patent: Nov. 5, 2013

(54) METHOD AND APPARATUS FOR PERFORMING ASYNCHRONOUS AND SYNCHRONOUS RESET REMOVAL DURING SYNTHESIS

(75) Inventor: Valavan Manohararajah, Scarborough (CA)

(73) Assignee: Altera Corporation, San Jose, CA (US)

( * ) Notice: Subject to any disclaimer, the term of this patent is extended or adjusted under 35 U.S.C. 154(b) by 506 days.

(21) Appl. No.: 12/800,227

(22) Filed: May 11, 2010

(65) Prior Publication Data

US 2011/0283250 A1   Nov. 17, 2011

(51) Int. Cl.
*G06F 17/50* (2006.01)

(52) U.S. Cl.
USPC .......................................... 716/101; 716/102

(58) Field of Classification Search
USPC ................................. 716/100–104
See application file for complete search history.

(56) References Cited

U.S. PATENT DOCUMENTS

| | | | |
|---|---|---|---|
| 6,526,559 B2 * | 2/2003 | Schiefele et al. | 326/11 |
| 7,343,569 B1 | 3/2008 | Lam et al. | |
| 7,594,211 B1 | 9/2009 | Tian et al. | |
| 7,622,947 B1 * | 11/2009 | Danskin | 326/38 |
| 2007/0220453 A1 | 9/2007 | Tobita | |

OTHER PUBLICATIONS

PCT Search Report and Written Opinion for Application No. PCT/US2011/035807 mailed Dec. 27, 2011.
Notification Concerning Transmittal of International Preliminary Report on Patentability mailed Nov. 22, 2012, and PCT Written Opinion of the International Searching Authority mailed Dec. 27, 2011 for Application No. PCT/US2011/035807.

* cited by examiner

*Primary Examiner* — Binh Tat
(74) *Attorney, Agent, or Firm* — L. Cho

(57) ABSTRACT

A method for designing a system on a target device is disclosed. A system is synthesized by converting a high level description of the system into gates, registers, and reset circuitry. An analysis is performed to identify and remove redundant reset circuitry. The system is optimized after the redundant reset circuitry has been removed. Other embodiments are disclosed.

27 Claims, 11 Drawing Sheets

METHOD AND APPARATUS FOR PERFORMING ASYNCHRONOUS AND SYNCHRONOUS RESET REMOVAL DURING SYNTHESIS

FIELD

Embodiments of the present invention relate to tools for designing systems on target devices. More specifically, embodiments of the present invention relate to a method and apparatus for asynchronous and synchronous reset removal during synthesis.

BACKGROUND

Electronic designs for large systems may include millions of gates and megabits of embedded memory. Of the tasks required for managing and optimizing electronic designs on a target device, synthesis, placement, and routing utilizing available resources can be among the most challenging and time consuming. The complexity of large systems often requires the use of computer aided design (CAD) or electronic design automation (EDA) tools to manage and optimize designs for a system. CAD tools perform the time-consuming tasks of synthesis, placement, and routing on a target device.

Registers in a system may be connected to a reset signal that operates to put the system into a known state during start up or after the occurrence of an error. The reset signal may be used to reset the system upon the occurrence of an event or after an amount of time has passed. Register resets, however, pose challenges for designing a system onto a target device. Challenges for asynchronous and synchronous resets include achieving timing closure when having to fan a reset signal out to a large number of destinations, and performing fitting with limited wiring resources allocated for resets while complying with clustering constraints associated with the resets. Asynchronous resets may further impose further challenges with sequential optimization issues. Sequential optimization algorithms used by CAD or EDA tools may bypass registers with asynchronous signals such as resets or loads. If the sequential optimizations are not bypassed, startup conditions created by the asynchronous reset are still maintained after retiming. Furthermore, logic may need to be packed into sequential elements without reset which require additional logic to be added to ensure correct startup behavior.

BRIEF DESCRIPTION OF THE DRAWINGS

The features and advantages of embodiments of the present invention are illustrated by way of example and are not intended to limit the scope of the embodiments of the present invention to the particular embodiments shown.

SUMMARY

According to an embodiment of the present invention, an analysis is performed during synthesis that identifies portions of a system that become redundant under a particular reset condition and identifies resets that can be removed. After removal of the resets, optimizations in synthesis may be performed and placement and routing of the system may be performed. According to an aspect of the present invention, the analysis includes identification of reset signals in the system. Register sets with common reset signals are identified. For each register in a register set a reset condition is applied and a redundant portion of the system is identified and assigned a cost value. For each register in the register set in cost order from highest to lowest that has not been marked for removal, the reset condition is applied and circuitry that is redundant, such as reset signal connections, is marked for removal. After all registers in the cost order have been analyzed, resets to registers in the circuitry marked for removal are removed.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
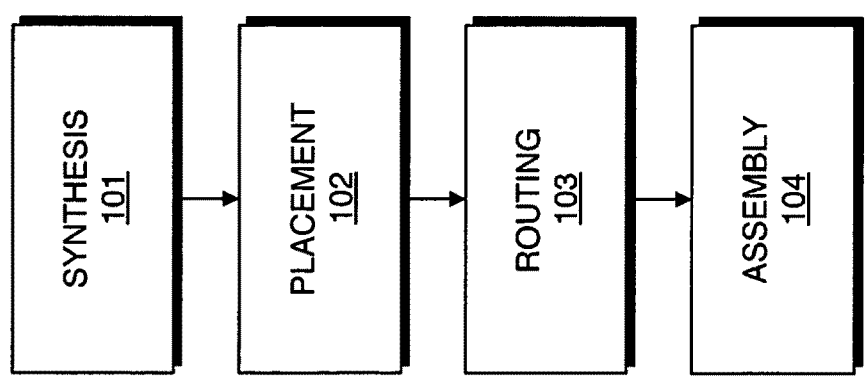
FIG. 1 is a flow chart illustrating a method for designing a system according to an exemplary embodiment of the present invention.

FIG. 1 is a flow chart illustrating a method for designing a system on a target device according to an exemplary embodiment of the present invention. The target device may be a field programmable gate array (FPGA), application specific integrated circuit (ASIC), a structured ASIC, or other device. According to one embodiment, the procedure illustrated in FIG. 1 may be performed by a computer aided design (CAD)/electronic design automation (EDA) tool implemented on a computer system. At 101, the system is synthesized. According to an embodiment of the present invention, synthesis involves generating a logic design of the system to be implemented.

Figure 2:
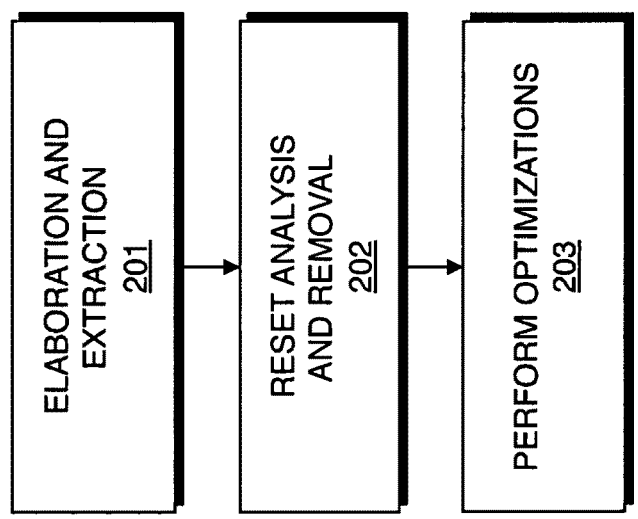
FIG. 2 is a flow chart illustrating a method for performing synthesis according to an exemplary embodiment of the present invention.

FIG. 2 is a flow chart illustrating a method for performing synthesis according to an embodiment of the present invention. The method illustrated in FIG. 2 may be utilized to perform 101. At 201 elaboration and extraction is performed.

According to an embodiment of the present invention, elaboration and extraction includes generating a logical representation of the system from a high level description of the system. The high level description of the system may be in the form of schematics, VHDL, Verilog or other design definition. The logical representation may include a representation that includes functional blocks and registers ("components"), such as logic gates and logic elements, required for the system. During elaboration and extraction, initial optimizations may also be performed. The initial optimizations may include the cleanout of netlists and constant propagation. An extraction netlist is created during extraction.

At 202, partitions are identified from the extraction netlist. According to an embodiment of the present invention, register resets are analyzed to identify portions of the system that become redundant under a particular reset condition. The analysis involves computing a cost of the effect of redundancy for each register reset. Circuitry associated with supporting register resets to these redundant portions of the system is removed based on the cost computed.

At 203, optimizations are applied to the revised system design. The reset analysis and removal procedure may have caused signals in the system to have lost a fanout or to have been set to a constant in the cases of synchronous resets. The optimization may include register retiming, fine state machine re-synthesis, and other optimization procedures. The optimization may include RTL synthesis where large/course blocks are optimized and gate level synthesis where simple blocks are optimized.

At 204, mapping (technology mapping) is performed on the optimized logic design. According to an embodiment of the present invention, mapping includes determining how to implement logic gates and logic elements in the optimized logic representation with resources available on the target device. The resources available may include LUTs and other resources. According to an embodiment of the present invention, a netlist is generated from mapping. This netlist may be an optimized technology-mapped netlist generated from the HDL.

Referring back to FIG. 1, at 102, components in the mapped logical system design are placed. Placement works on the optimized technology-mapped netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 103, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 104, an assembly procedure is performed. The assembly procedure involves creating a data file that includes information determined by the compilation procedure described by 101-103. The data file may be a bit stream that may be used to program a target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

At 105, the target device is programmed with the data file. By programming the target with the data file, components on the target device are physically transformed to implement the system.

Figure 3:
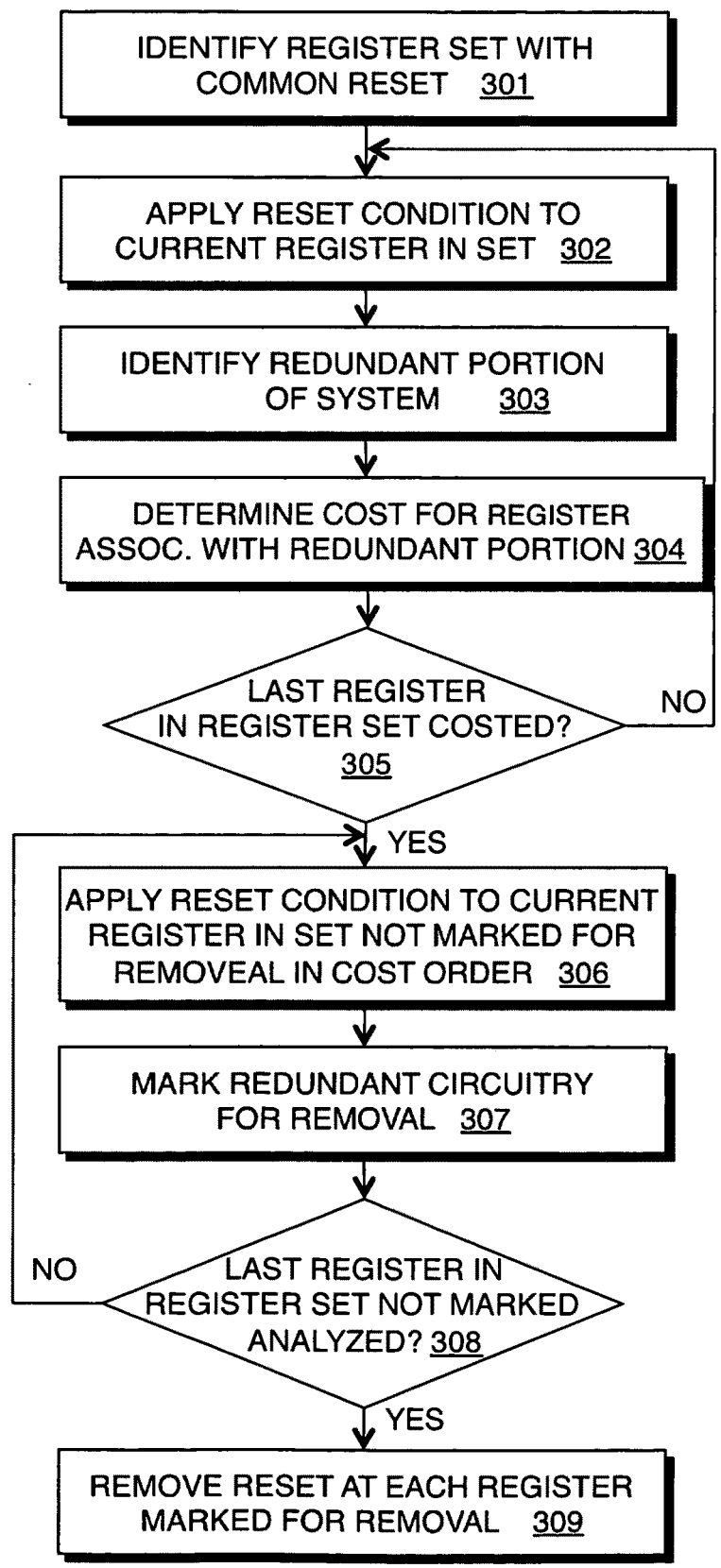
FIG. 3 illustrates a method for performing reset analysis and removal according to an exemplary embodiment of the present invention.

FIG. 3 illustrates a method for performing reset analysis and removal according to an embodiment of the present invention. The method illustrated in FIG. 3 may be implemented at 202 in FIG. 2. At 301, a register set R(x) with a common reset signal x is identified. According to an embodiment of the present invention, the register set has a minimum number of register where the number is predetermined. In one embodiment, the minimum number is in the magnitude of a hundred thousand.

Procedures 302-305 are performed on each register in register set R(x).

At 302, a reset condition is applied to a current register y in register set R(x) that has not previously been considered. According to an embodiment of the present invention, the reset condition may be a reset signal that causes a register to output a 0. Alternatively, the reset condition may be a preset signal that causes a register to output a 1.

At 303, a redundant portion of the system is identified. According to an embodiment of the present invention the redundant portion of the system is a portion of the system is any portion that becomes redundant under the reset condition applied at 302.

Figure 4:
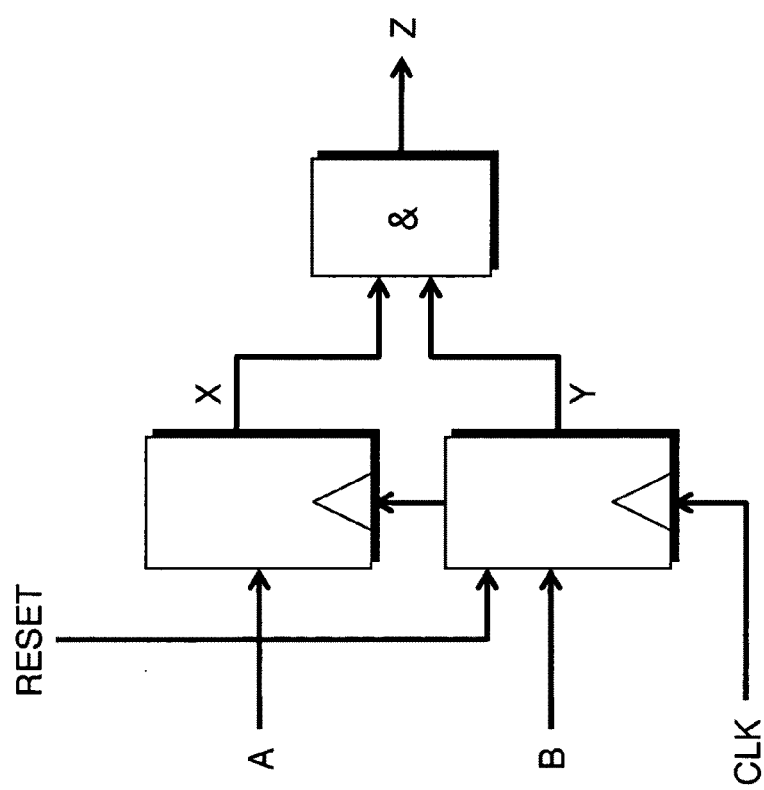
FIG. 4 illustrates a first example of a redundant portion of a system according to an exemplary embodiment of the present invention.

FIG. 4 illustrates a first example of a redundant portion of a system according to an embodiment of the present invention. FIG. 4 illustrates a part of a system with two registers, registers X and Y, and a logic gate Z. Register X receives input signal A and register Y receives input signal B. Registers X and Y are clocked by the same clock signal, CLK, and share a common reset signal. When the reset is triggered, both registers X and Y outputs a zero. Since logic gate Z is an AND gate, the output of logic gate Z is zero when at least one of the outputs of registers X and Y are zero. If the reset signal were connected to only one of the registers X and Y, the output of logic gate z would be the same. Thus, in this example, when a reset condition is applied to register X, the redundant portion of the system would include register Y.

Figure 5:
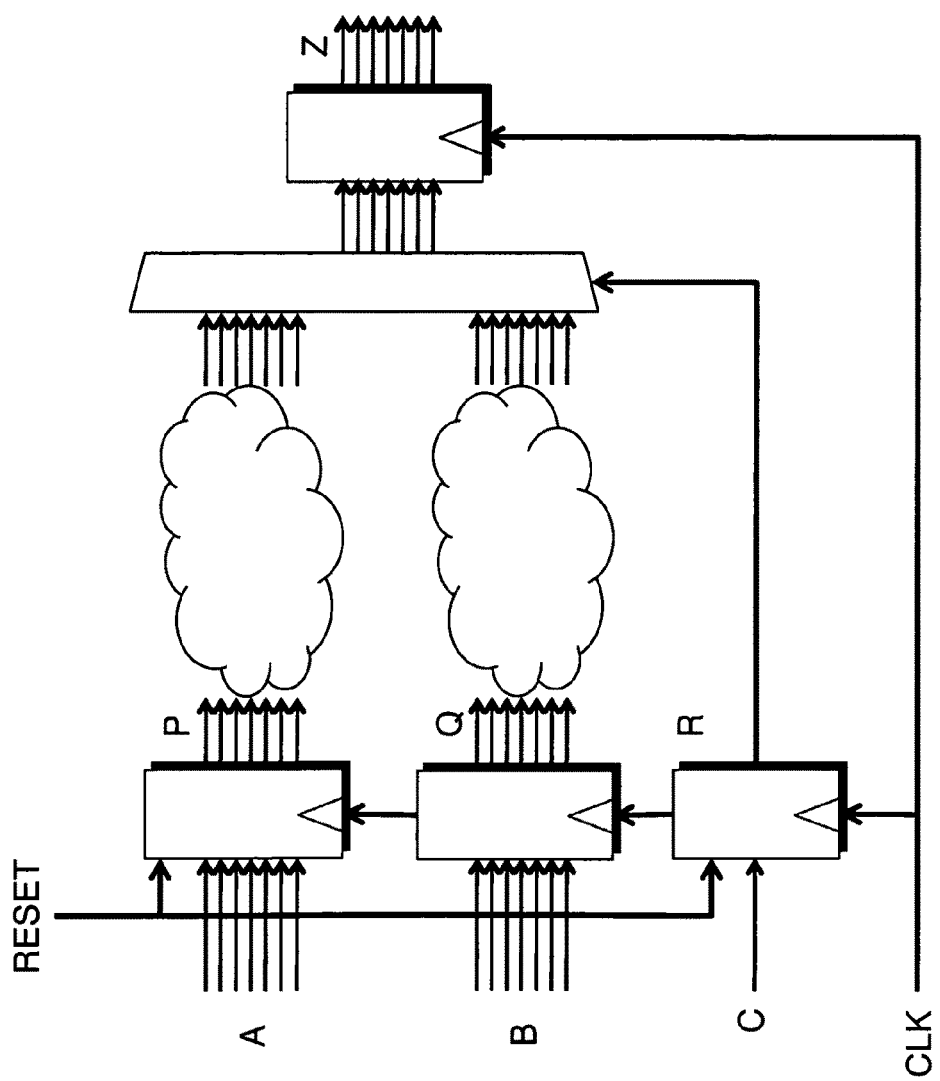
FIG. 5 illustrates a second example of a redundant portion of a system according to an embodiment of the present invention.

FIG. 5 illustrates a second example of a redundant portion of a system according to an embodiment of the present invention. FIG. 5 illustrates a part of a system with a first bank of registers P and a second bank of registers Q, a control register R, and a bank of output registers Z. Registers P receive input signals A and registers Q receive inputs B. Registers P, Q, R, and Z are clocked by the same clock signal, CLK. Registers P, Q, and R share a common reset signal. Multiplexer M selects the inputs originating from either registers P or registers Q. Under a reset condition, control register R outputs a zero which causes multiplexer M to select the inputs originating from registers P, regardless of the condition or output of register Q. Thus, in this example, when a reset condition is applied to register R, the redundant portion of the system would include register Q.

Referring back to FIG. 3, at 304, a cost for the current register y is computed based on the redundant portion of the system identified. According to an embodiment of the present invention the cost may be based on a fraction of the system that becomes redundant, a number of logic gates, registers, and/or number or length of wires that become redundant, a depth of the circuitry that becomes redundant, or other metric.

At 305, it is determined whether a cost has been computed for a last register (all of the registers) in register set R(x). If a cost has not been computed for a last register in the register set, control returns to 302 to perform procedures 302-304 on a next register in register set R(x). If a cost has been computed for the last register in the register set, control proceeds to 306.

Procedures 306-309 are performed on each of the registers in register set R(x) which have not been marked for removal.

At 306, a reset condition is applied to a current register y in register set R(x) that has not previously been marked for removal in cost order.

At 307, a redundant portion of the system resulting from the application of the reset condition is marked for removal.

At 308, it is determined whether a last register y in the register set R(x) that has not previously been marked for removal has had a reset condition applied. If the last register in the register set that has not previously been marked for removal has had not had a reset condition applied, control returns to 306 to perform procedures 306-307 on a next register in the register set. If the last register in the register set that has not previously been marked for removal has had a reset condition applied, control proceeds to 309.

At 309, resets at each register that is marked for removal is removed.

It should be appreciated that procedures 301-309 may be repeated and applied to other register sets in a system to identify additional resets to remove. It should further be appreciated that the method described in FIG. 3 may be use to perform reset analysis and removal of asynchronous or synchronous resets. The procedures in the method described in FIG. 3 should be applied to each group of resets (asynchronous or synchronous) 301-309 separately. According to an embodiment of the present invention, procedures 301-309 are applied to asynchronous resets before being applied to synchronous resets.

According to an embodiment of the present invention, when removing synchronous resets at registers marked for removal, if a synchronous reset is present at a register, the reset is removed. However, if the reset signal is coupled to a data input, the connection may be traced backwards from the register through single fanout nodes to a synchronous reset signal where the reset signal is set to an opposite value.

Figure 6:
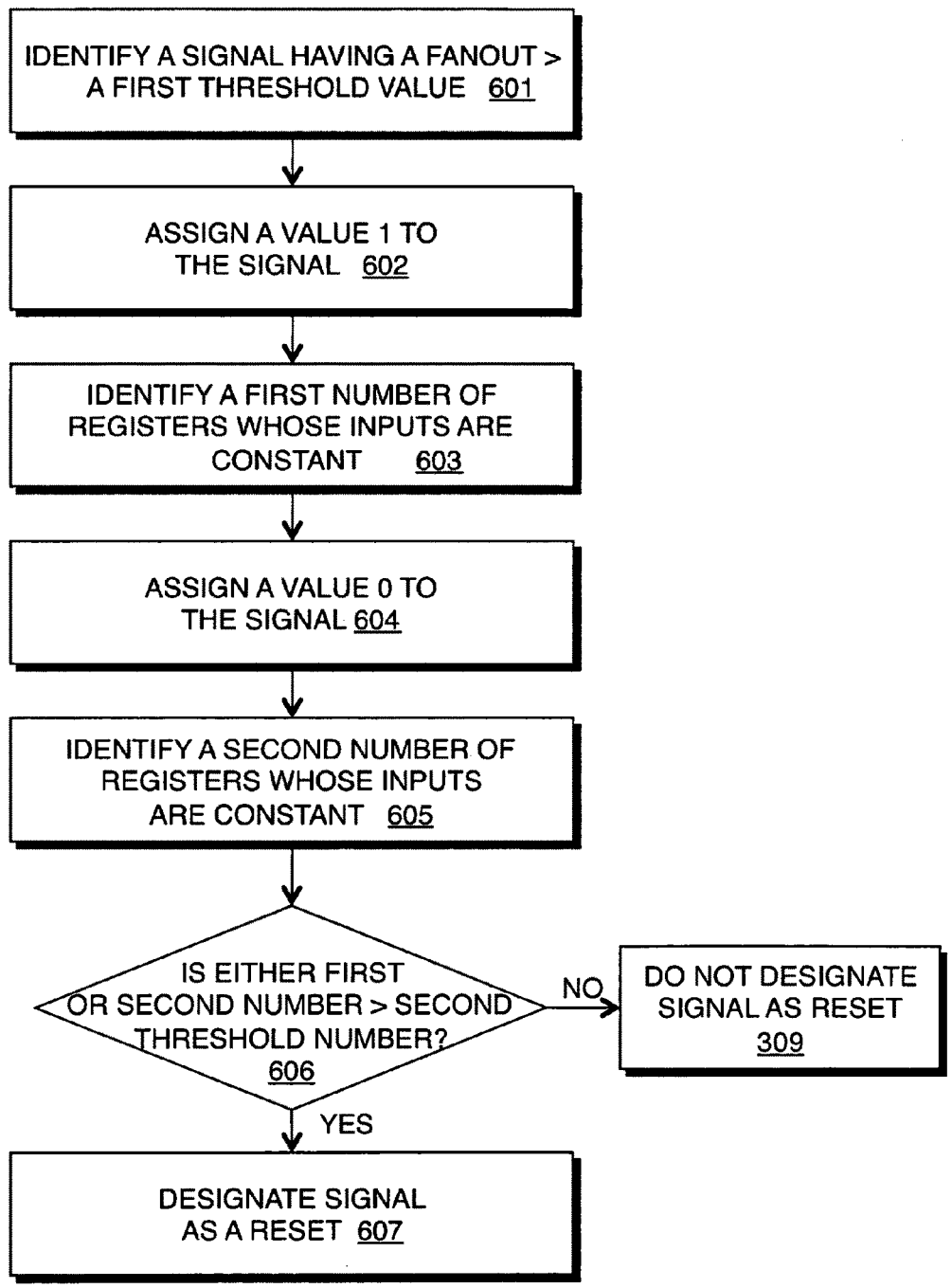
FIG. 6 illustrates a method for performing synchronous reset identification according to an exemplary embodiment of the present invention.

FIG. 6 illustrates a method for performing synchronous reset identification according to an embodiment of the present invention. The method described in FIG. 6 may be performed prior to using the method described in FIG. 3 to perform reset analysis and removal on synchronous resets. At 601, a signal i with a number of fanouts greater than a first threshold number is identified.

At 602, a value of 1 is assigned to the signal.

At 603, a first number of registers with inputs that are constant are identified after evaluating logic conditions with assigning the value of 1 to the signal.

At 604, a value of 0 is assigned to the signal.

At 605, a second number of registers with inputs that are constant are identified after evaluating logic conditions with assigning the value of 0 to the signal.

At 606, it is determined whether the larger of either the first number of registers or the second number of registers is greater than a second threshold number. If the larger of either the first number of registers or the second number of registers is greater than the second threshold number, control proceeds to 607. If the larger of either the first number of registers or the second number of registers is not greater than the second threshold number, control proceeds to 608.

At 607, the signal is designated as a reset signal.

At 608, the signal is not designated as a reset signal.

It should be appreciated that procedures 601-608 may be repeated and applied to other signals to determine whether the signals are reset signals.

With reference to the procedure described above, it should be appreciated that a first predetermined threshold value and a second predetermined threshold value may be used. The first predetermined threshold value may be used to first identify signals with high fanout. The second predetermined threshold value may be used to identify registers that become constant prior to identifying whether a signal is a synchronous reset. According to one aspect of the present invention, the first predetermined threshold value may be larger than the second predetermined threshold value.

According to an embodiment of the present invention, signals are identified that may be used as a reset or preset signal. A signal is a "reset" if it causes a register to go to zero. A signal is a "preset" if it causes a register to go to one. For asynchronous resets/presets, a signal may be identified as either a reset or preset by examining whether the port which it is coupled to on the register is a reset or preset port. For synchronous resets/presets, an analysis may be required to identify whether the signal is a reset or a preset. The analysis may involve first identifying a signal that has a high fanout and can potentially set registers to one or zero. Next, a determination is made as to what happens when the signal is set to one or zero. If a large number of registers (greater than a threshold number) becomes zero than a reset has been identified. However, if a large number of registers becomes one, than a present has been identified.

FIGS. 1-3, and 6 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 7:
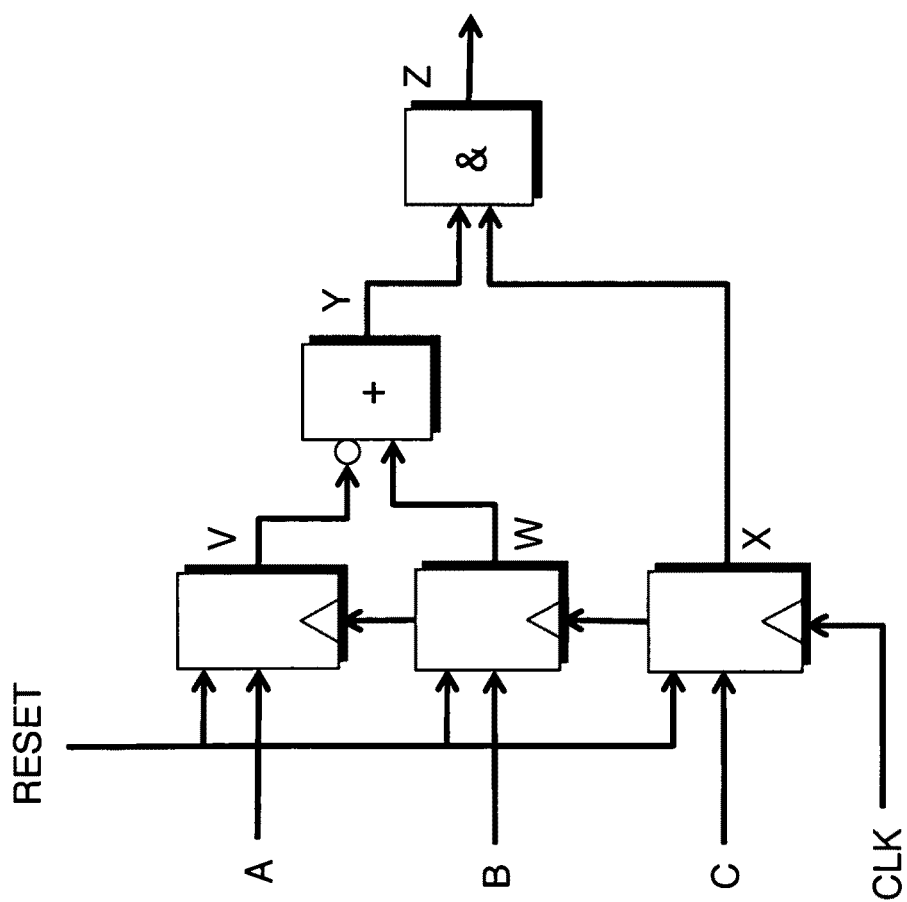
FIG. 7 illustrates an example of performing reset analysis and removal according to an embodiment of the present invention.

FIG. 7 illustrates an example of performing reset analysis and removal according to an embodiment of the present invention. FIG. 7 illustrates a portion of a system having registers V, W, and X. Register V receives input signal A. Register W receives input signal B. Register X receives input signal C. Registers V, W, and X are clocked by CLK, and share a reset signal. Logic gate Y is an OR gate and logic gate Z is an AND gate.

Referring to FIG. 3, at 301 registers V, W, and X are identified as having a common reset.

At 302 and 303, when a reset condition is applied to register V, the output of register V becomes 0. The output of V goes through an inverter before being input into logic gate Y. With an input of 1 being input to logic gate Y, logic gate Y outputs a 1 at all times, regardless of the input from register W. Thus, the input from register W becomes redundant. Since logic gate Z is an AND gate, the input to logic gate Z from register X is still relevant.

At 304, the cost for the redundant portion, register W, is 1 register. It should be appreciated that other metrics could be used to cost the redundant portion.

At 305, register V is not the last register in the register set to be analyzed for cost. Control returns to 302 to evaluate register W.

At 302 and 303, when a reset condition is applied to register W, the output of register W becomes 0. The output of W is input to logic gate Y. Since logic gate Y is an OR gate, the other input to logic gate Y is still relevant. Thus, there are no redundant portions of the system when a reset condition is applied to register W.

At 304, the cost for the redundant portion is 0.

At 305, register W is not the last register in the register set to be analyzed for cost. Control returns to 302 to evaluate register X.

At 302 and 303, when a reset condition is applied to register X, the output of register X becomes 0. Since logic gate Z is an AND gate, with the input from register X being a 0, logic gate Z outputs a 0 at all times, regardless of the input from logic gate Y. Thus, the input from logic gate Y becomes redundant, and logic gate Y, and registers V and W are redundant.

At 304, the cost for the redundant portion, logic gate Y and registers V and W, is 1 logic gate and 2 registers. It should be appreciated that other metrics could be used to cost the redundant portion.

At 305, since registers V, W, and X have all been analyzed for cost, control proceeds to 306.

At 306, the register of highest cost order is determined to be register X. Since register X has not been marked for removal, a reset condition is applied to register X.

At 307, the redundant portions logic gate Y and registers V and W are marked for removal.

At 308, since register X is the last register in the register set that has not been marked and has been analyzed, control proceeds to 309.

At 309, the reset at each register marked for removal is removed.

The example illustrated in FIG. 7 can be for an asynchronous reset or for a synchronous reset. It should be appreciated that when removing resets for synchronous resets, if synchronous reset is present at a register (SCLR), the reset may be removed. Alternatively, if a synchronous reset is not present at a register, a trace backwards may be performed from the register through single fanout nodes to the synchronous reset signal. The reset signal may then be removed by setting it to an opposite value.

Figure 8:
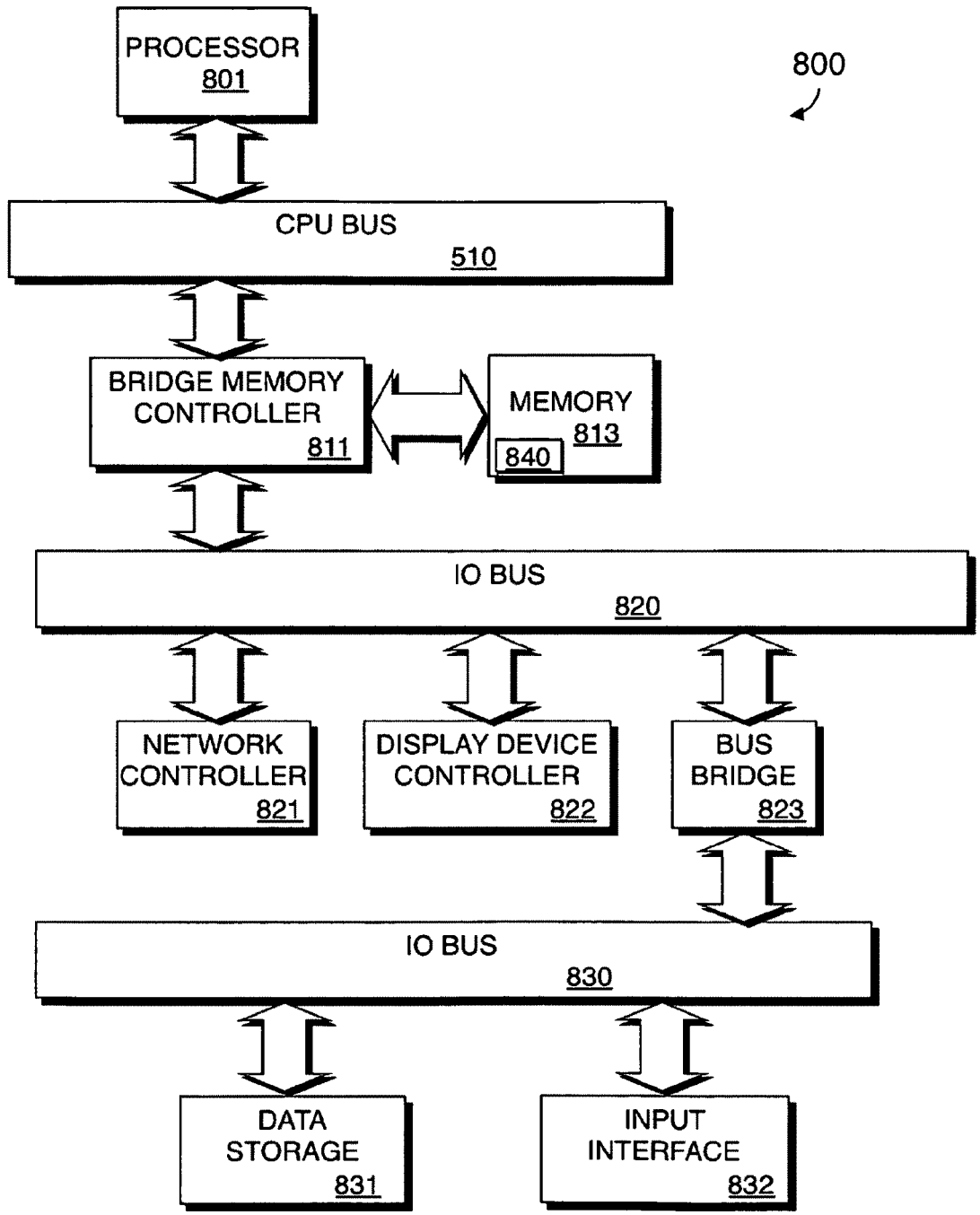
FIG. 8 illustrates a block diagram of a computer system implementing a system designer according to an embodiment of the present invention.

FIG. 8 illustrates a block diagram of a computer system implementing a system designer according to an embodiment of the present invention. As shown, the computer system 800 includes a processor 801. The processor 801 is coupled to a CPU bus 810 that transmits data signals between the processor 801 and other components in the computer system 800.

The computer system 800 includes a memory 813. The memory 813 may be a dynamic random access memory device, a static random access memory device, and/or other memory device. The memory 813 may store instructions and code represented by data signals that may be executed by the processor 801. A bridge memory controller 811 is coupled to the CPU bus 810 and the memory 813. The bridge memory controller 811 directs data signals between the processor 801, the memory 813, and other components in the computer system 800 and bridges the data signals between the CPU bus 810, the memory 813, and a first IO bus 820.

The first IO bus 820 may be a single bus or a combination of multiple buses. The first IO bus 820 provides communication links between components in the computer system 800. A network controller 821 is coupled to the first IO bus 820. The network controller 821 may link the computer system 800 to a network of computers (not shown) and supports communication among the machines. A display device controller 822 is coupled to the first IO bus 820. The display device controller 822 allows coupling of a display device (not shown) to the computer system 800 and acts as an interface between the display device and the computer system 800.

A second IO bus 830 may be a single bus or a combination of multiple buses. The second IO bus 830 provides communication links between components in the computer system 800. A data storage device 831 is coupled to the second IO bus 830. The data storage device 831 may be a hard disk drive, a floppy disk drive, a CD-ROM device, a flash memory device or other mass storage device. An input interface 832 is coupled to the second IO bus 830. The input interface 832 allows coupling of an input device to the computer system 800 and transmits data signals from an input device to the computer system 100. A bus bridge 823 couples the first IO bus 820 to the second IO bus 830. The bus bridge 823 operates to buffer and bridge data signals between the first IO bus 820 and the second IO bus 830. It should be appreciated that computer systems having a different architecture may also be used to implement the computer system 800.

A system designer 840 may reside in memory 813 and be executed by the processor 801. The system designer 840 may operate to synthesize the system, place the system on a target device, route the system, assemble the system, and program a target device to implement the system. During synthesis, an analysis may be performed by the system designer 840 to identify portions of a system that become redundant under a particular reset condition and identify resets that can be removed. After removing the identified resets, optimizations in synthesis may be performed.

Figure 9:
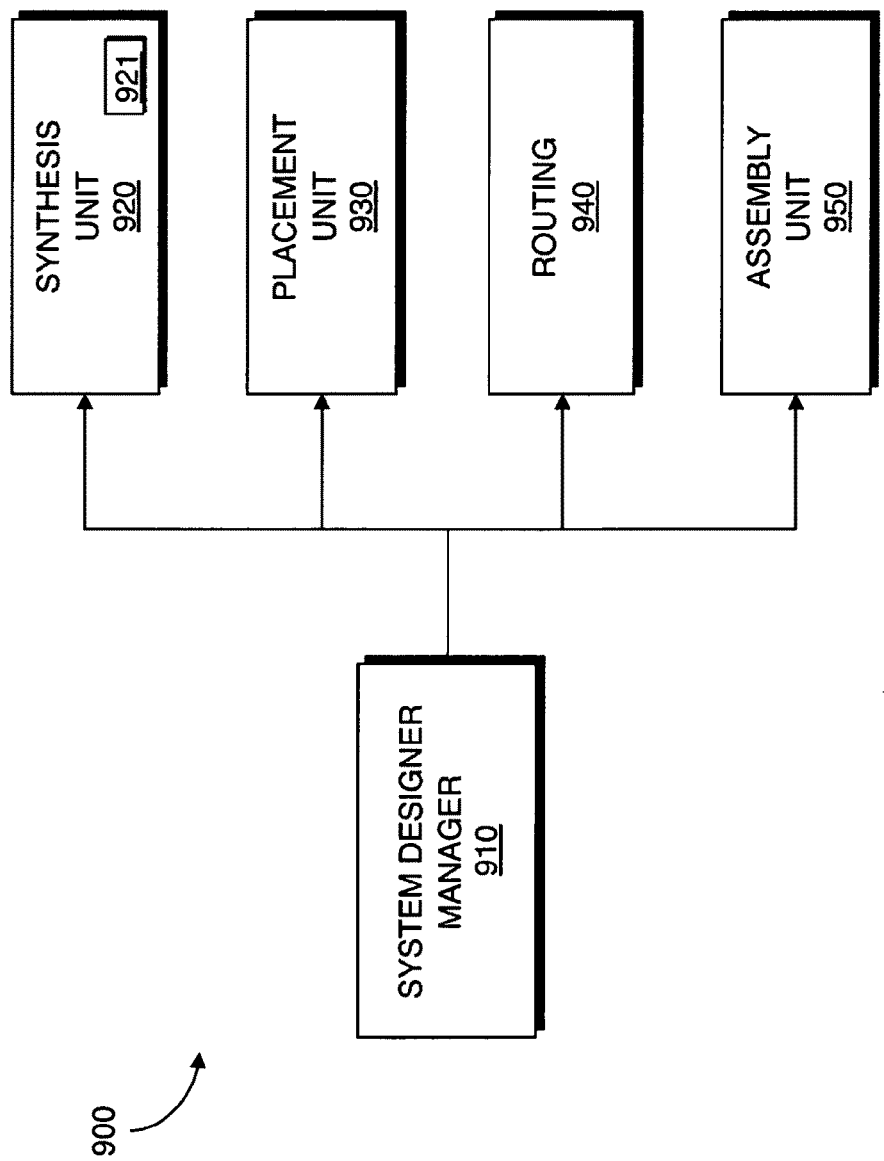
FIG. 9 is a block diagram of a system designer according to an exemplary embodiment of the present invention.

FIG. 9 illustrates a system designer 900 according to an exemplary embodiment of the present invention. The system designer 900 may be used to implement the system designer 840 shown in FIG. 8 and may perform procedures described in FIGS. 1-3 and 6. The system designer 900 may be a CAD tool for designing a system on a target device. The target device may be, for example, an ASIC, a structured ASIC, an FPGA, a programmable logic device (PLD), a printed circuit board (PCB), or other circuitry. FIG. 9 illustrates modules implementing an embodiment of the system designer 900. According to one embodiment, system design may be performed by a computer system, such as for example the computer system illustrated in FIG. 8, executing sequences of instructions represented by the modules shown in FIG. 9. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 900 includes a system designer manager 910. The system designer manager 910 is connected to and transmits data between the components of the system designer 900. The system design manager 910 may also perform elaboration on design information that is inputted into the system designer 900. Elaboration may include reviewing the design information to ensure that the syntax of the information is correct.

Block 920 represents a synthesis unit. According to an embodiment of the present invention, the synthesis unit 920 performs elaboration and extraction which includes generating a logical representation of the system from a high level description of the system. The high level description of the system may be in the form of schematics, VHDL, Verilog or other design definition. The logical representation may include a representation that includes functional blocks and registers ("components"), such as logic gates and logic elements, required for the system. The synthesis unit 920 includes a reset analysis and removal unit 921 that analyzes register resets to identify portions of the system that become redundant under a particular reset condition. The analysis involves computing a cost of the effect of redundancy for each register reset. Circuitry associated with supporting register resets to these redundant portions of the system is removed based on the cost computed. After removal of the circuitry associated with supporting register resets to the redundant portions of the system, optimizations are applied to the revised system design. The optimization may include register retiming, fine state machine re-synthesis, and other optimization procedures. The optimization may include RTL synthesis where large/course blocks are optimized and gate level synthesis where simple blocks are optimized. The synthesis unit 920 also performs mapping (technology mapping) on the optimized logic design. According to an embodiment of the present invention, mapping includes determining how to implement logic gates and logic elements in the optimized logic representation with resources available on the target device. The resources available may include LUTs and other resources. According to an embodiment of the present invention, a netlist is generated from mapping. This netlist may be an optimized technology-mapped netlist generated from the HDL.

Block 930 represents a placement unit. The placement unit 930 places the system on to the target device by determining which components or areas on the target device are to be used for specific functional blocks and registers. According to an embodiment of the system designer 900, the placement unit 930 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 930 may utilize a cost function in order to determine a good assignment of resources on the target device.

Block 940 represents a routing unit. The routing unit 940 determines the routing resources on the target device to use to provide interconnection between the components implementing functional blocks and registers of the logic design.

Block 950 represents an assembly unit. The assembly unit 950 creates a data file that includes information determined by the compilation procedure performed by the system designer 900. The data file may be a bit stream that may be used to program a target device. According to an embodiment of the present invention, the data file generated may be transmitted to another computer system to allow the design of the system to be further processed. Alternatively, the data file may be transmitted to another computer system which may be used to program the target device according to the system design. By programming the target device with the data file, components on the target device are physically transformed to implement the system. It should be appreciated that the design of the system may also be output in other forms such as on a display device or other medium.

Figure 10:
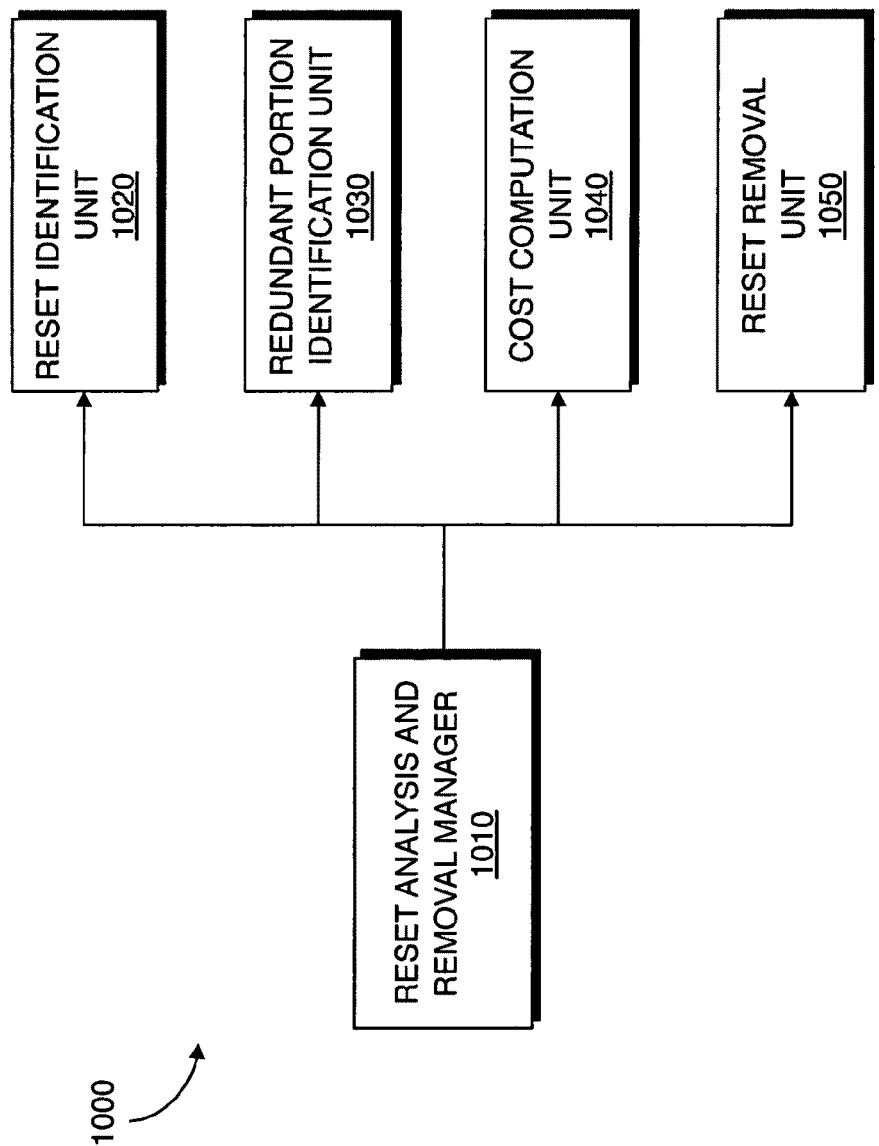
FIG. 10 is a block diagram of a reset analysis and removal unit according to an embodiment of the present invention.

FIG. 10 is a block diagram of a reset analysis and removal unit 1000 according to an embodiment of the present invention. The reset analysis and removal unit 1000 may be used to implement the reset analysis and removal unit 921 illustrated in FIG. 9. The reset analysis and removal unit 1000 includes a reset analysis and removal manager 1010. The reset analysis and removal manager 1010 is coupled to and transmits information between components in the reset analysis and removal unit 1000.

The reset analysis and removal manager 1000 includes a reset identification unit 1020. The reset identification unit 1020 operates to identify synchronous resets. According to an embodiment of the present invention, the reset identification unit 1020 may perform the procedures illustrated in FIG. 6 to identify synchronous resets from signals in the system.

The reset analysis and removal unit 1000 includes a redundant portion identification unit 1030. According to an embodiment of the present invention, the redundant portion identification unit 1030 identifies redundant portions of a system by identifying a register set R(x) with a common synchronous reset x, applying a reset condition to each register y in register set R(x) at a time, and analyzing the condition of the logic in the system to identify portions of the system that do not impact other logic in the system when the reset condition is applied.

The reset analysis and removal unit 1000 includes a cost computation unit 1040. The cost computation unit 1040 computes a cost for each register y based on the redundant portion of the system identified. According to an embodiment of the present invention the cost may be based on a fraction of the system that becomes redundant, a number of logic gates and/or number or length of wires that become redundant, a depth of the circuitry that becomes redundant, or other metric.

The reset analysis and removal unit 1000 includes a reset removal unit 1050. The reset removal unit 1050 applies a reset condition to each register y in register set R(x) that has not previously been marked for removal in cost order. The reset removal unit 1050 marks the redundant portion of the system resulting from the application of the reset condition for removal until all of the registers in register R(x) that have not previously been marked for removal has had a reset condition applied. Resets at each register that is marked for removal are then removed. When removing synchronous resets at registers marked for removal, if a synchronous reset is present at a register, the reset is removed. However, if the reset signal is coupled to a data input, the connection may be traced backwards from the register through single fanout nodes to a synchronous reset signal where the reset signal is set to an opposite value.

Embodiments of the present invention have been discussed with reference to identifying and removing redundant reset signals. It should be appreciated that embodiments of the present invention may also be used to identify and remove redundant preset signals in the same manner.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 11:
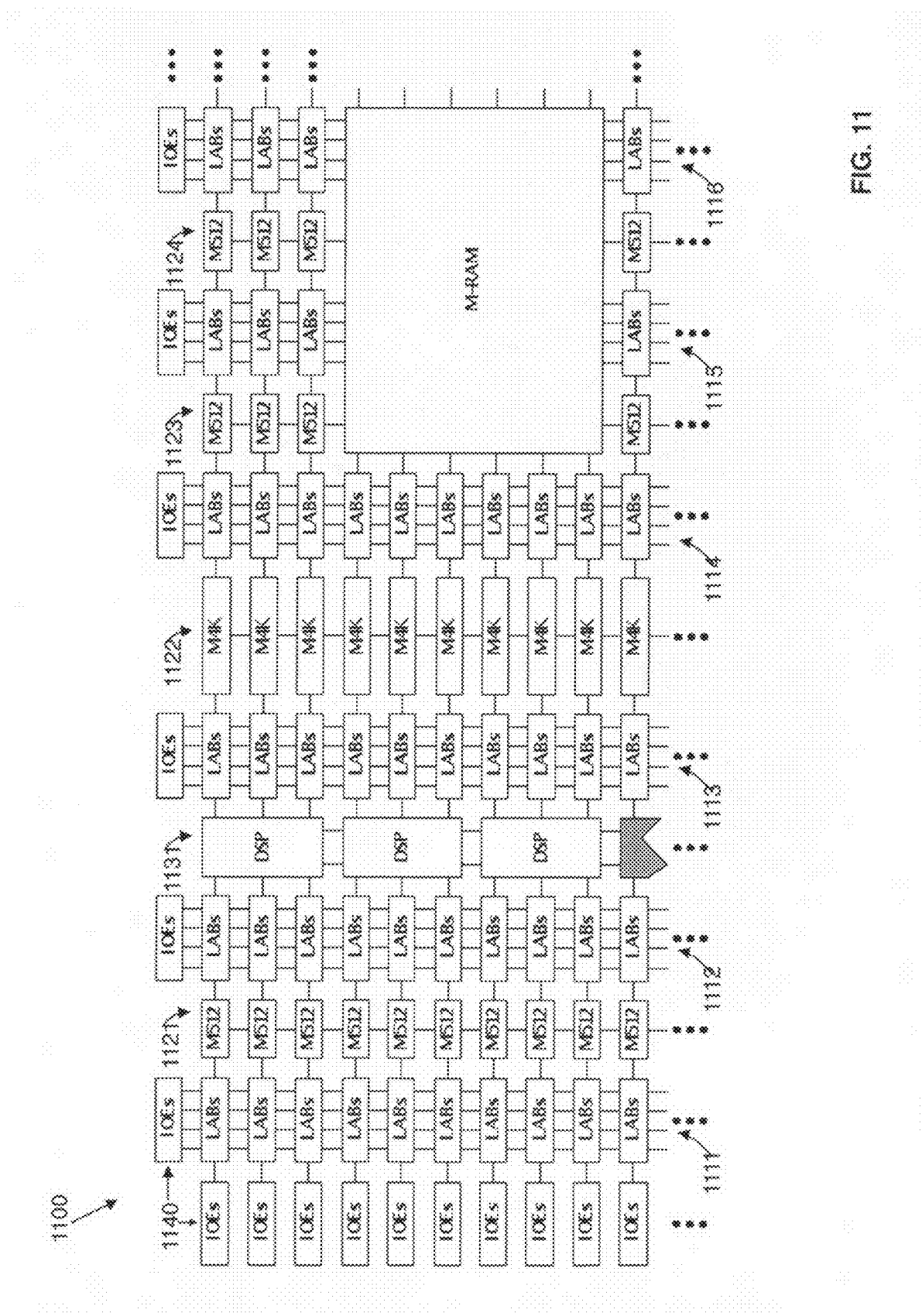
FIG. 11 illustrates an exemplary target device according to an embodiment of the present invention.

FIG. 11 illustrates a device 1100 that may be used to implement a target device according to an embodiment of the present invention. The device 1100 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 1100. Columns of LABs are shown as 1111-1116. It should be appreciated that the logic block may include additional or alternate components.

The device 1100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1100. Columns of memory blocks are shown as 1121-1124.

The device 1100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1100 and are shown as 1131.

The device 1100 includes a plurality of input/output elements (IOEs) 1140. Each IOE feeds an IO pin (not shown) on the device 1100. The IOEs 1140 are located at the end of LAB rows and columns around the periphery of the device 1100. Each IOE may include a bidirectional IO buffer and a plurality of registers for registering input, output, and output-enable signals.

The device 1100 may include routing resources such as LAB local interconnect lines, row interconnect lines ("H-type wires"), and column interconnect lines ("V-type wires") (not shown) to route signals between components on the target device.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
identifying a register set in the system with a common reset signal;
for each register in the register set, identifying a corresponding redundant portion of the system upon applying a reset condition on the register;
determining a cost for each register based on an amount of redundancy of the system reflected in the redundant portion of the system identified; and
for each register in the register set that does not correspond to a reset that has been removed, from highest to lowest cost order, remove the reset signal coupled to the identified corresponding redundant portion to the register.

2. The method of claim 1, wherein the reset signal is an asynchronous reset signal.

3. The method of claim 1, wherein the reset signal is a synchronous reset signal.

4. The method of claim 1, wherein identifying the register set comprises identifying at least a predetermined number of registers.

5. The method of claim 4 wherein the predetermined number is in the magnitude of a hundred thousand.

6. The method of claim 1, wherein determining a cost for each register based on the redundant portion of the system identified comprises accounting for a fraction of the system that becomes redundant.

7. The method of claim 1, wherein determining a cost for each register based on the redundant portion of the system identified comprises accounting for a number of logic gates, registers, and wires that become redundant.

8. The method of claim 1, wherein determining a cost for each register based on the redundant portion of the system identified comprises accounting for a depth of circuitry that becomes redundant.

9. The method of claim 3, further comprising identifying a synchronous reset signal.

10. The method of claim 9, wherein identifying a synchronous reset signal comprises:
identify a signal with a fanout greater than a first threshold value;
identify a first number of registers with inputs that are constant when assigning a value of 1 to the signal;
identify a second number of registers with inputs that are constant when assigning a value of 0 to the signal; and
if either the first number or second number is larger than a second threshold value, designate the signal as a synchronous reset signal.

11. The method of claim 3, wherein removing the reset signal comprises tracing backwards from a register through single fanout nodes to a synchronous reset signal and setting the reset signal to an opposite value.

12. The method of claim 1, further comprising performing optimizations on the system after removing the reset signal.

13. The method of claim 12, further comprising:
placing the system on the target device; and
routing the system on the target device.

14. A non-transitory computer-readable medium having stored thereon sequences of instructions, the sequences of instructions when executed by a processor causes the processor to perform:
synthesizing a system by converting a high level description of the system into gates, registers, and reset circuitry;
identifying a register set in the system with a common reset signal;

for each register in the register set, identifying a corresponding redundant portion of the system upon applying a reset condition on the register;

determining a cost for each register based on the redundant portion of the system identified; and for each register in the register set that does not correspond to a reset that has been removed, from highest to lowest cost order, remove the reset signal coupled to the identified corresponding redundant portion to the register; and optimizing the system after the redundant reset circuitry has been removed.

15. The non-transitory computer-readable medium of claim 14, wherein reset circuitry associated with asynchronous reset signals are identified and removed before reset circuitry associated with synchronous reset signals.

16. The non-transitory computer-readable medium of claim 14, wherein identifying the register set comprises identifying at least a predetermined number of registers.

17. The non-transitory computer-readable medium of claim 14, wherein determining a cost for each register based on the redundant portion of the system identified comprises accounting for a fraction of the system that becomes redundant.

18. The non-transitory computer-readable medium of claim 14, wherein determining a cost for each register based on the redundant portion of the system identified comprises accounting for a depth of circuitry that becomes redundant.

19. The non-transitory computer-readable medium of claim 14, further comprising identifying a synchronous reset signal.

20. The non-transitory computer-readable medium of claim 19, wherein identifying a synchronous reset signal comprises:

identify a signal with a fanout greater than a first threshold value;

identify a first number of registers with inputs that are constant when assigning a value of 1 to the signal;

identify a second number of registers with inputs that are constant when assigning a value of 0 to the signal; and if either the first number or second number is larger than a second threshold value, designate the signal as a synchronous reset signal.

21. The non-transitory computer-readable medium of claim 14, further comprising:

placing the system on the target device; and routing the system on the target device.

22. A system designer, comprising:

a redundant portion identification unit operable to identify a plurality of registers in the system with a common reset signal, and operable to identify for each register in the plurality of registers a corresponding redundant portion of the system upon applying a reset condition on the register;

a cost computation unit operable to determine a cost for each register based on an amount of redundancy of the system reflected in the redundant portion of the system identified; and a reset removal unit operable to remove the reset signal coupled to the identified corresponding redundant portion to the register for each register in the plurality of registers that does not correspond to a reset that has been removed, from highest to lowest cost order.

23. The system designer of claim 22, wherein the cost comprises a cost value based upon a fraction of the system that becomes redundant.

24. The system designer of claim 22, wherein the cost comprises a cost value based upon a number of logic gates, registers, and wires that become redundant.

25. The system designer of claim 22, wherein the cost comprises a cost value based upon a depth of circuitry that becomes redundant.

26. The system designer of claim 22, further comprising a reset identification unit to identify a synchronous reset signal.

27. The system designer of claim 22, wherein the redundant portion identification unit, cost computation unit, and reset removal unit reside in a synthesis unit that performs optimizations on the system after resets have been removed.

* * * * *